(12) United States Patent
Vernon, Sr.

(10) Patent No.: US 6,328,903 B1
(45) Date of Patent: Dec. 11, 2001

(54) SURFACE-MICROMACHINED CHAIN FOR USE IN MICROELECTROMECHANICAL STRUCTURES

(75) Inventor: George E. Vernon, Sr., Rio Rancho, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/520,643

(22) Filed: Mar. 7, 2000

(51) Int. Cl.⁷ .................... B81B 5/00; B81B 7/04
(52) U.S. Cl. .................... 216/2; 216/39; 216/109; 59/8
(58) Field of Search .................... 216/2, 38, 39, 216/51, 56, 95, 99, 109; 249/57; 474/207, 101; 59/1, 8, 10, 35.1, 84

(56) References Cited

U.S. PATENT DOCUMENTS

| 5,631,514 | 5/1997 | Garcia | 310/309 |
| 5,804,084 | 9/1998 | Nasby | 216/2 |

OTHER PUBLICATIONS

Ikuta, K.; Maruo, S.; Kojima, S., Micro–Electro–Mechanical Systems, 1998. MEMS 98. Proceedings, The Eleventh Annual International Workshop on, 1998 pp. 290–295).*

* cited by examiner

Primary Examiner—Randy Gulakowski
Assistant Examiner—Allan Olsen
(74) Attorney, Agent, or Firm—John P. Hohimer

(57) ABSTRACT

A surface-micromachined chain and a microelectromechanical (MEM) structure incorporating such a chain are disclosed. The surface-micromachined chain can be fabricated in place on a substrate (e.g. a silicon substrate) by depositing and patterning a plurality of alternating layers of a chain-forming material (e.g. polycrystalline silicon) and a sacrificial material (e.g. silicon dioxide or a silicate glass). The sacrificial material is then removed by etching to release the chain for movement. The chain has applications for forming various types of MEM devices which include a microengine (e.g. an electrostatic motor) connected to rotate a drive sprocket, with the surface-micromachined chain being connected between the drive sprocket and one or more driven sprockets.

41 Claims, 14 Drawing Sheets

Section 1-1

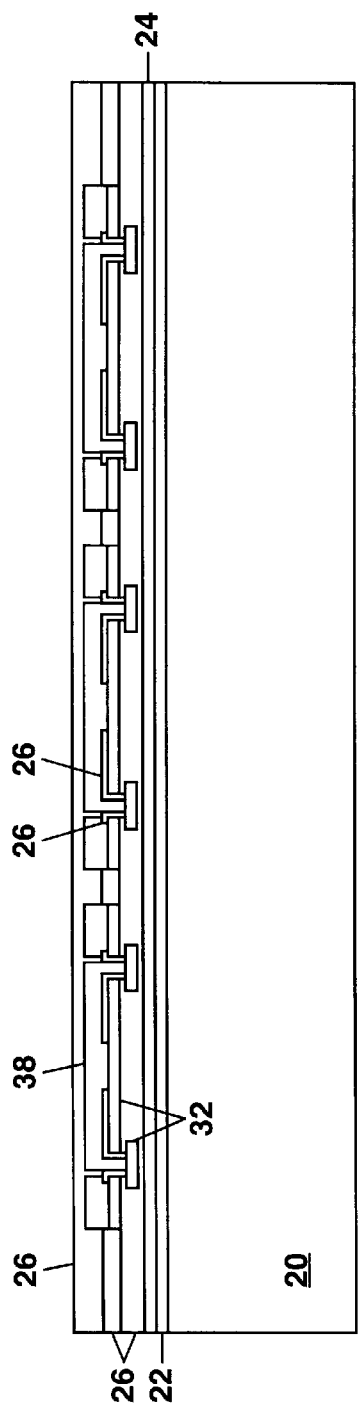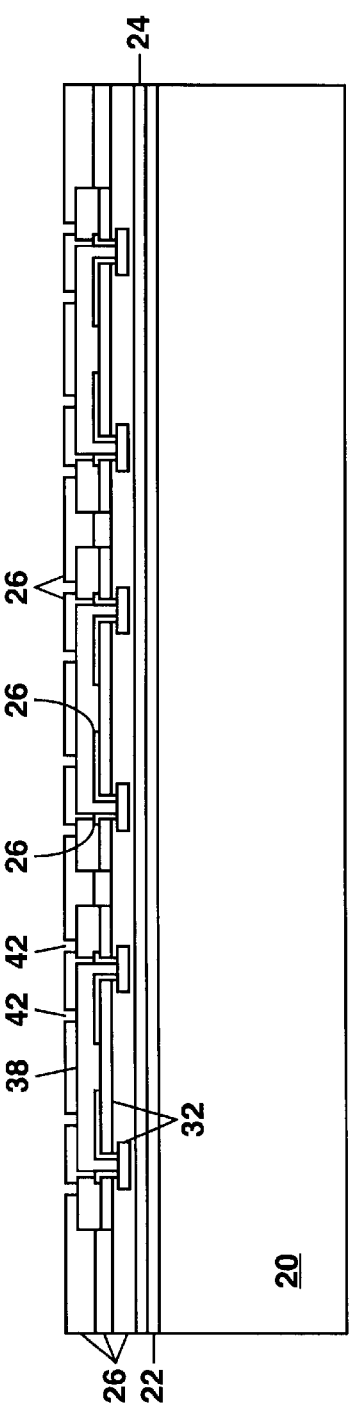

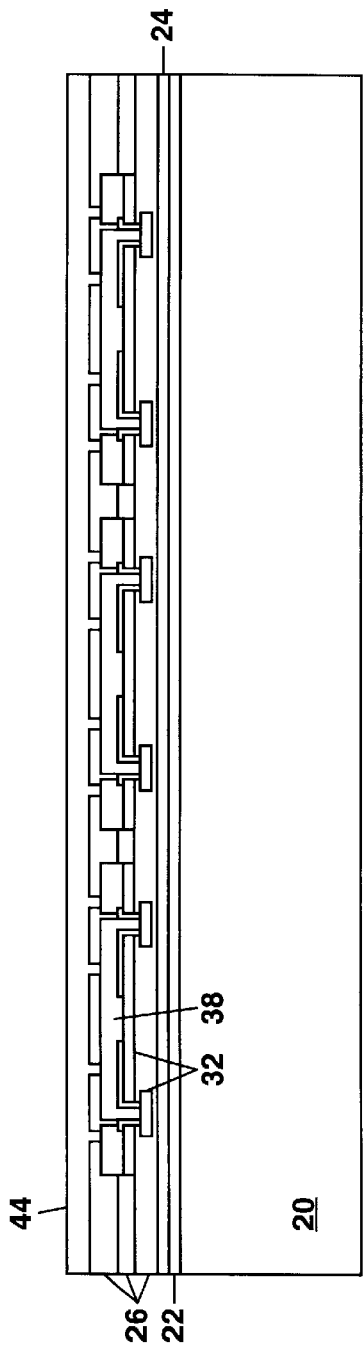
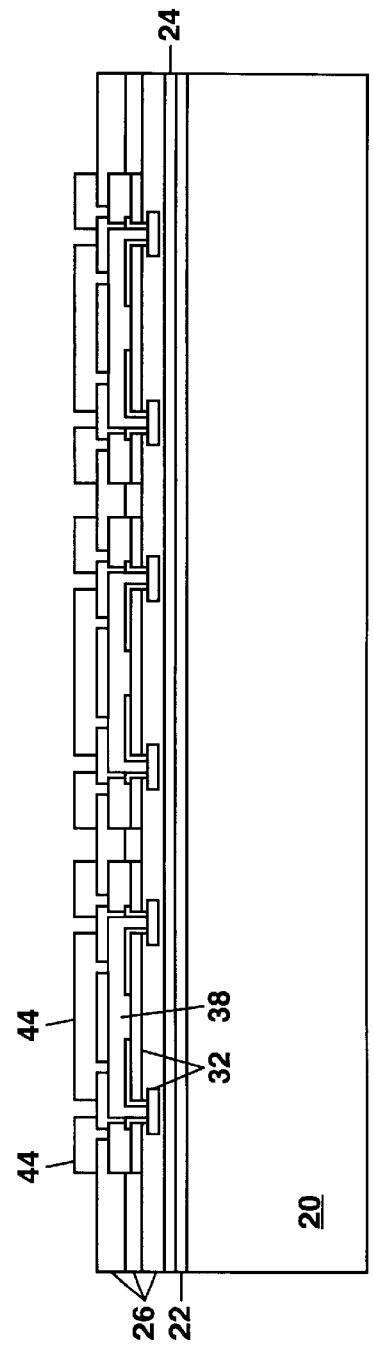

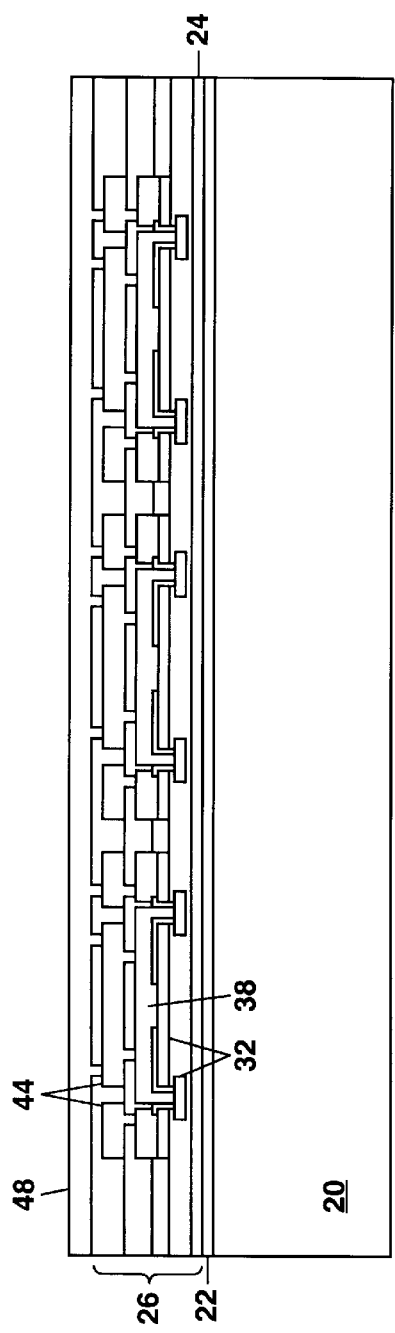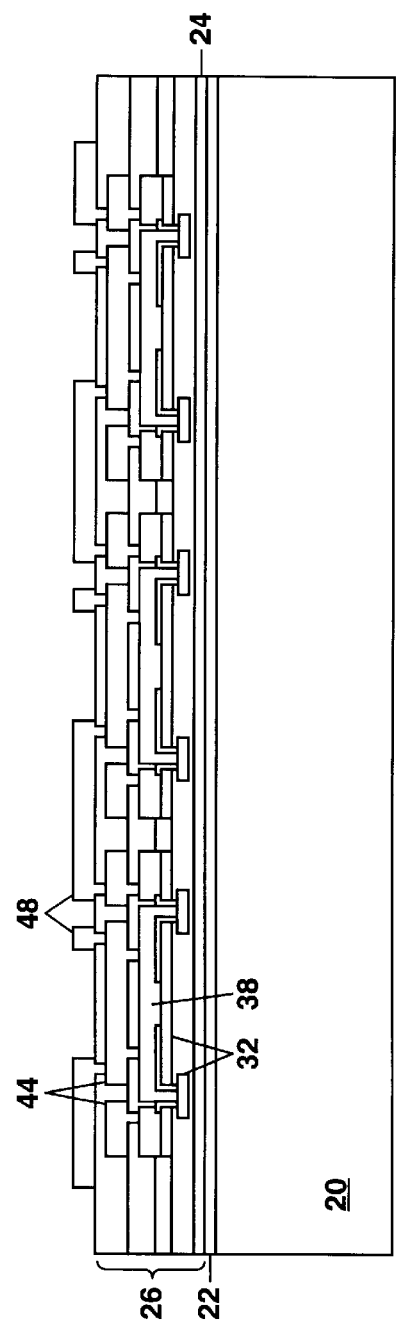

6,328,903 B1

SURFACE-MICROMACHINED CHAIN FOR USE IN MICROELECTROMECHANICAL STRUCTURES

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates generally to microelectromechanical (MEM) devices, and in particular to a surface-micromachined chain for use in a MEM device or structure.

BACKGROUND OF THE INVENTION

Polysilicon surface micromachining adapts planar fabrication process steps known to the integrated circuit (IC) industry to manufacture microelectromechanical or micromechanical devices. The standard building-block processes for polysilicon surface micromachining are deposition and photolithographic patterning of alternate layers of low-stress polycrystalline silicon (also termed polysilicon) and a sacrificial material (e.g. silicon dioxide or a silicate glass). Vias etched through the sacrificial layers at predetermined locations provide anchor points to a substrate and for mechanical and electrical interconnections between the polysilicon layers. Functional elements of the device are built up layer by layer using a series of deposition and patterning process steps. After the device structure is completed, it can be released for movement by removing the sacrificial material in part or entirely by exposure to a selective etchant such as hydrofluoric acid (HF) which does not substantially attack the polysilicon layers.

The result is a construction system that generally consists of a first layer of polysilicon which provides electrical interconnections and/or a voltage reference plane (e.g. a ground plane), and up to three or more additional layers of mechanical polysilicon which can be used to form functional elements ranging from simple cantilevered beams to complex systems such as a microengine connected to a gear train. Typical in-plane lateral dimensions of the functional elements can range from one micron to several hundred microns or more, while individual layer thicknesses are typically about 1–3 microns. Because the entire process is based on standard IC fabrication technology, a large number of fully-assembled devices can be batch-fabricated on a silicon substrate without any need for piece-part assembly.

For various types of microelectromechanical (MEM) devices, a precise control over movement, positioning or timing of a plurality of rotary members is needed. Such precise movement, positioning or timing control has previously been achieved using a gear train. However, gear trains require precise fabrication and are limited in their utility when the rotary members are widely spaced, or when a plurality of rotary members at different locations must be driven at the same angular speed.

An advantage of the present invention is that a surface-micromachined chain can be integrally formed on a substrate and used to simultaneously drive one or more rotary members (e.g. sprockets) that are located at a distance from a motive source (e.g. a microengine).

Another advantage is that the surface-micromachined chain of the present invention allows a single motive source (e.g. a microengine) to drive a plurality of rotary members (e.g. sprockets) in synchronism.

Yet another advantage of the present invention is that the surface-micromachined chain can be used to combine the mechanical power from a plurality of motive sources.

A further advantage of the present invention is that the surface-micromachined chain can be formed in place on a substrate without any piece-part assembly required.

These and other advantages of the method of the present invention will become evident to those skilled in the art.

SUMMARY OF THE INVENTION

The present invention relates to a surface-micromachined chain, comprising a plurality of interconnected chain links, with each chain link further comprising a plurality of deposited and patterned material layers. Each chain link can comprise a two-part link body having an inner circular member surrounded by an outer annular member, and at least one link arm extending outward from the outer annular member to connect to the inner circular member of an adjacent two-part link body. The interconnected chain links can be formed integrally on a substrate (e.g. a silicon substrate) without the need for any piece-part assembly. By integrally forming the chain links using surface micromachining, each link arm, which generally comprises polycrystalline silicon (also termed polysilicon), is permanently attached to the outer annular member of one two-part link body and to the inner circular member of an adjacent two-part link body. Additionally, the link arms can be formed coplanar with each other. Each link in the surface-micromachined chain can also be substantially identical in size and shape to all the remaining chain links. The particular size of each chain link will depend upon particular applications thereof, but will generally be in the range of 5–1000 microns in length, and about 2–20 microns in thickness. Each chain link is formed to be jointed and flexible in a plane parallel to the substrate, while being substantially inflexible in a direction perpendicular to the substrate. This allows the individual chain links to be moveable over a surface of the substrate in sliding contact with the surface of the substrate, or alternately to be supported slightly above the surface of the substrate.

The present invention also relates to a surface-micromachined chain formed integrally on a substrate (e.g. a silicon substrate) for coupling mechanical power from a motive source to a load on the substrate, with the chain comprising a plurality of link arms connected at each end thereof to flexible joints, and with the link arms and flexible joints being formed, at least in part, from polycrystalline silicon. Each flexible joint can comprise an inner circular member surrounded by an outer annular member which can also be substantially circular in shape, with the inner circular member being permanently attached to one end of one of the link arms, and with the cuter annular member being permanently attached to an opposite end of an adjacent link arm. The link arms and the flexible joints can be formed from a plurality of deposited and patterned layers of polycrystalline silicon. The spacing between the flexible joints (i.e. the pitch of the chain) can be, for example, in the range of 5–1000 microns; and the flexible joints can be adapted to drive or to be driven by a sprocket formed on the substrate using the same process steps used for forming the chain.

The present invention further relates to a surface-micromachined structure formed on a substrate (e.g. comprising silicon), with the structure comprising a drive sprocket formed on the substrate for providing motive power, a driven sprocket formed on the substrate at a distance from the drive sprocket, and a chain formed on the substrate, at least in part, from polycrystalline silicon and connected between the drive sprocket and the driven sprocket to couple the motive power from the drive sprocket to the driven sprocket thereby imparting motion to the driven sprocket. The chain can comprise a plurality of interconnected chain links each about 5–1000 microns long and 2–20 microns thick. Each chain link can further comprise a two-part link body having an outer annular member surrounding an inner circular member, with at least one link arm extending outward from the outer annular member to connect to the inner circular member of an adjacent two-part link body.

One or more electrostatic actuators can also be formed on the substrate and operatively connected to the drive sprocket to provide mechanical power to rotate the drive sprocket. Furthermore, a chain tensioner can be formed on the substrate to reduce any slack in the chain. The chain tensioner can comprise a laterally-moveable idler sprocket formed on the substrate, with the idler sprocket being mounted on a platform and moveable into a path of the chain to deflect the chain and thereby reduce the slack therein.

The present invention also relates to a surface-micromachined structure (i.e. a microelectromechanical device) formed on a substrate. The structure generally comprises one or more microengines formed on the substrate, a drive sprocket formed on the substrate proximate to the microengine and operatively connected thereto, with the drive sprocket being rotatable upon electrical actuation of the microengine. The structure also includes at least one driven sprocket formed on the substrate distal to the drive sprocket. The drive sprocket is connected to the driven sprocket by a chain formed on the substrate from a plurality of deposited and patterned material layers (e.g. comprising one or more layers of polysilicon), thereby imparting motion to the driven sprocket upon rotation of the drive sprocket. The structure can further comprise a chain tensioner to reduce any slack therein. The chain tensioner can include, for example, an idler sprocket that is mounted on a slideable platform and laterally moveable into the path of the chain to deflect the chain and thereby reduce the slack therein.

The chain can comprise a plurality of interconnected chain links, with each chain link further comprising a two-part link body having an outer annular member surrounding an inner circular member, and at least one link arm extending outward from the outer annular member to connect to the inner circular member of an adjacent two-part link body. Each link arm can be permanently attached to the outer annular member of one two-part link body and to the inner circular member of an adjacent two-part link body. The links can also be formed coplanar; and can have a length in the range of 5–1000 microns.

Finally, the present invention relates to a method for forming a surface-micromachined chain on a substrate for coupling mechanical power from a motive source on the substrate to a load on the substrate, comprising steps for depositing and patterning a plurality of alternating layers of a chain-forming material and a sacrificial material on the substrate, thereby forming a plurality of interconnected chain links embedded in the layers of the sacrificial material; and removing the sacrificial material by etching (e.g. with a selective wet etchant comprising hydrofluoric acid) and thereby releasing the chain for operation. Each layer of the chain-forming material can comprise, for example, polycrystalline silicon; and the sacrificial material can comprise, for example, silicon dioxide or a silicate glass. The method of forming the surface-micromachined chain can also include a step for annealing each layer of the polycrystalline silicon chain-forming material after deposition and patterning thereof.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1A:
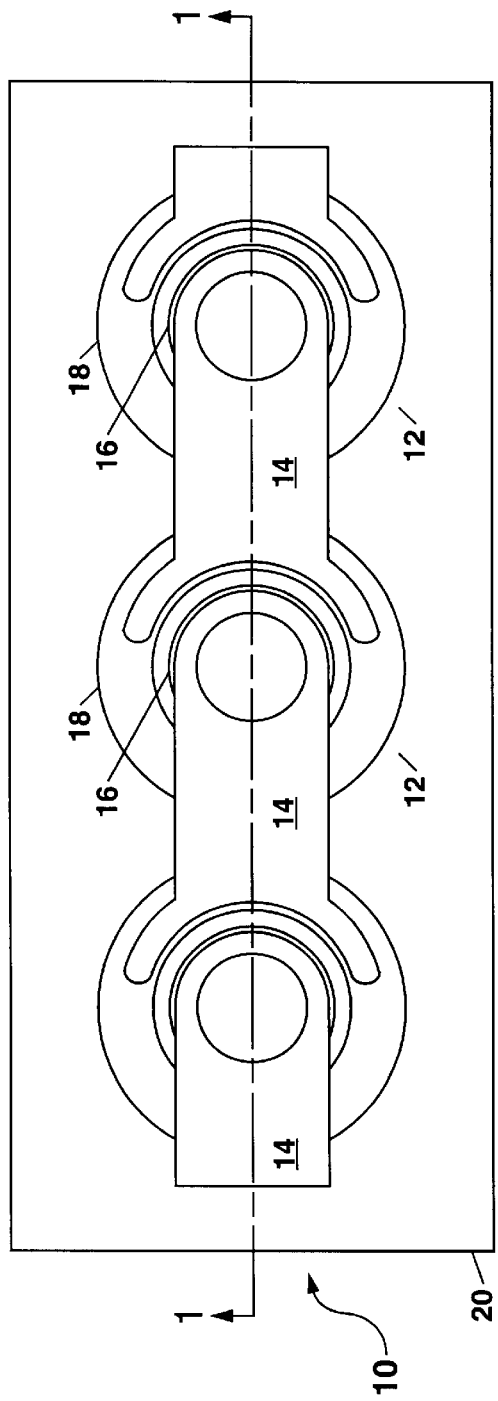
FIG. 1A shows a schematic plan view of a portion of a surface-micromachined chain formed on a substrate according to the present invention.

Referring to FIG. 1A, there is shown schematically in plan view an example of a surface-micromachined chain 10 formed according to the present invention. The chain 10 comprises a plurality of interconnected links, with each link further comprising a two-part link body 12 (also termed a roller) and a link arm 14. The link body 12 includes an inner circular member 16 surrounded by an outer annular member 18, with one end of each link arm 14 being permanently connected to the inner circular member 16, and with the opposite end of that same link arm 14 being permanently connected to the outer annular member 18 of an adjacent two-part link body 12. The outer annular member 18, which can be substantially circular in shape, forms a ring or a bearing; and the inner circular member 16 forms a journal about which the outer annular member 18 is free to rotate over an angle. Thus, the two-part link body 12 forms a flexible joint so that the chain 10 can flex or bend in a plane parallel to a substrate 20 whereon the chain 10 is formed, while being substantially rigid or inflexible in a direction perpendicular to the substrate 20.

Figure 1B:
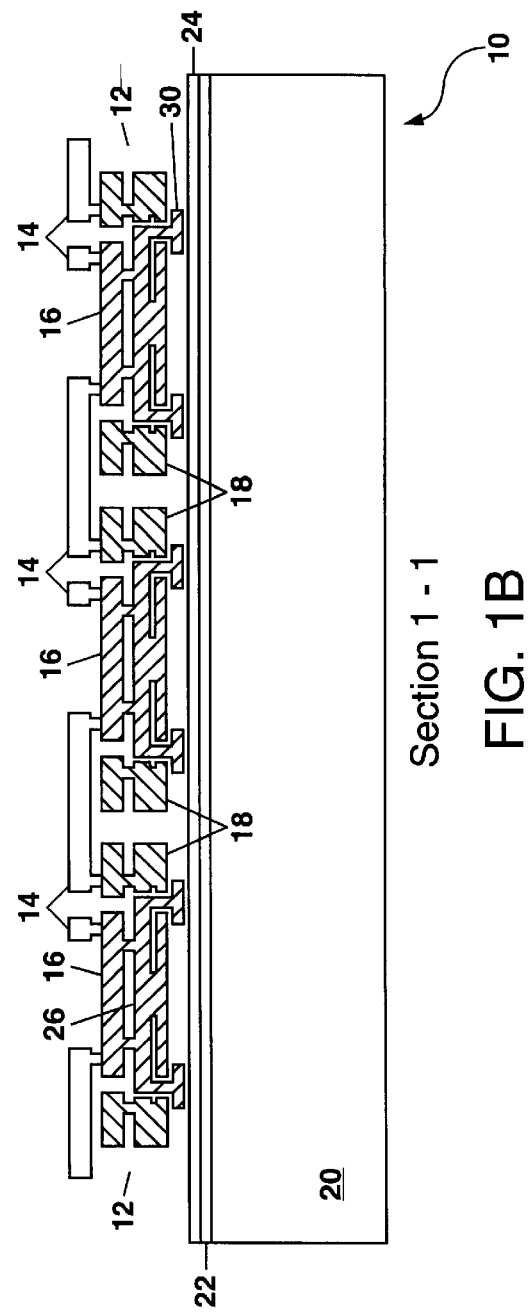
FIG. 1B shows a schematic cross-section view of the chain and substrate of FIG. 1 a along the section line 1—1.

A cross-sectional structure of the chain 10, which is formed in place on the substrate 20, is shown schematically in FIG. 1B. The chain 10 is formed using conventional surface micromachining processes to deposit and pattern a plurality of material layers (e.g. comprising, at least in part, polycrystalline silicon) on the substrate 20. The same micromachining process steps which are used to fabricate the chain 10 can also be used to fabricate other microelectromechanical or micromechanical elements on the substrate 20, including a drive sprocket for providing motive power (e.g. from a mechanical power source such as a microengine or one or more electrostatic actuators) and a driven sprocket. In this way, the chain 10 can be used to couple the motive power from the drive sprocket to the driven sprocket thereby imparting motion to the drive sprocket.

The surface-micromachined chain 10 can also form an integral part of a surface-micromachined structure formed on the substrate 20, with an microengine formed on the substrate 20 providing mechanical power to rotate a drive sprocket which can then couple the mechanical power through the chain 10 to one or more driven sprockets on the substrate. In this way, the chain can be used to drive and synchronize the motion of a plurality of elements in a microelectromechanical structure 100 (also termed herein a MEM device).

In FIG. 1, the substrate 20 generally comprises silicon (e.g. a monocrystalline silicon substrate or a silicon-on-insulator substrate), although those skilled in the art will understand that the teachings of the present invention are applicable to the formation of surface-micromachined chains 10 on other types of substrates (e.g. comprising a glass, ceramic, polymer, fused silica or III–V compound semiconductor) as known to the art of surface micromachining.

Figure 2A:
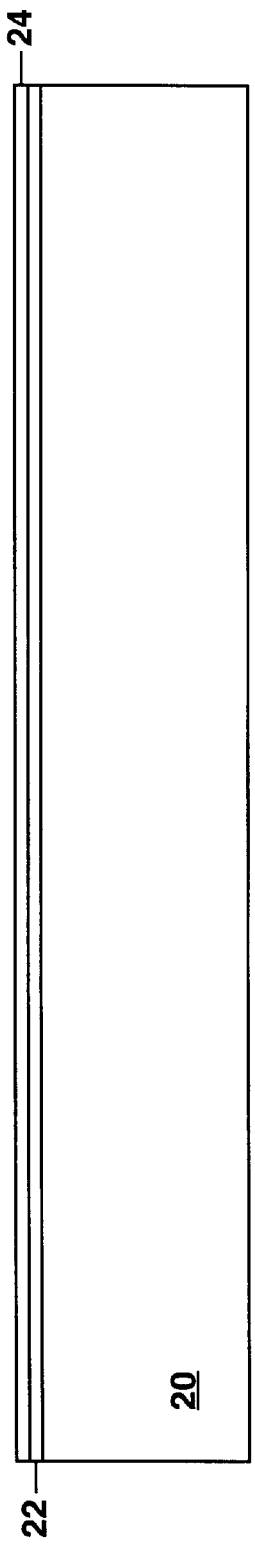
FIGS. 2A–2P show a series of surface-micromachining process steps for forming the chain of FIGS. 1A and 1B.

The formation of the chain 10 on the substrate 20 can be understood with reference to FIGS. 2A–2P which show in schematic cross-section view a series of process steps used to deposit and pattern a plurality of alternating layers of a chain-forming material (e.g. polycrystalline silicon) and a sacrificial material on the substrate 20 for use in forming the surface-micromachined chain 10. These process steps are based on surface micromachining which uses conventional IC processing steps, including material deposition, photolithography, masking, etching, mask stripping, and cleaning. Many individual process steps can be used to form the completed structure of the surface-micromachined chain 10 and other elements of a MEM device 100 which incorporates the chain 10 of the present invention. These process steps are used to repeatedly deposit and pattern a plurality of alternating layers of polycrystalline silicon (also termed polysilicon) and a sacrificial material (e.g. silicon dioxide or a silicate glass) to build up the chain 10 layer by layer. Altogether four or five layers or levels of polysilicon are generally used to form the chain 10.

The term "patterning" as used herein refers to a sequence of well-known IC processing steps including applying a photoresist to the substrate 20, prebaking the photoresist, aligning the substrate 20 with a photomask, exposing the photoresist through the photomask, developing the photoresist, baking the substrate, etching away the surfaces not protected by the photoresist, and stripping the protected areas of the photoresist so that further processing can take place. These individual process steps need not be recited in great detail since they are well-known to those skilled in the art. The term "patterning" can further include the formation of a hard mask (e.g. comprising about 500 nanometers of a silicate glass deposited from the decomposition of tetraethylortho silicate, also termed TEOS, by low-pressure chemical vapor deposition at about 750° C. and densified by a high temperature processing) overlying a polysilicon or sacrificial material layer in preparation for defining features into the layer by etching.

In FIG. 2A, a silicon substrate 20 is initially prepared by forming a thermal oxide layer 22 and a silicon nitride layer 24 blanketing the substrate 20. The thermal oxide layer 22, which can be about 0.6 $\mu$m thick, is formed by a conventional thermal diffusion process as known to the integrated circuit art whereby a surface portion of the substrate 20 is converted from silicon to silicon dioxide ($SiO_2$). A layer 24 of silicon nitride is then blanket deposited over the entire substrate 20 by a low-pressure chemical vapor deposition (LPCVD) process. The silicon nitride layer 24 can be, for example, about 0.8 $\mu$m thick. The thermal oxide and silicon nitride layers 22 and 24 electrically insulate the chain 10 and other devices and wiring formed on the substrate 20 from the substrate 20. Additionally, the silicon nitride layer 24 helps to protect the surface of the substrate 20 and the underlying thermal oxide layer 22 during subsequent processing and during an etch release step. Although only shown on a top surface of the substrate 20, the thermal oxide and nitride layers 22 and 24 can be formed over all exposed surfaces of the substrate.

Figure 3:
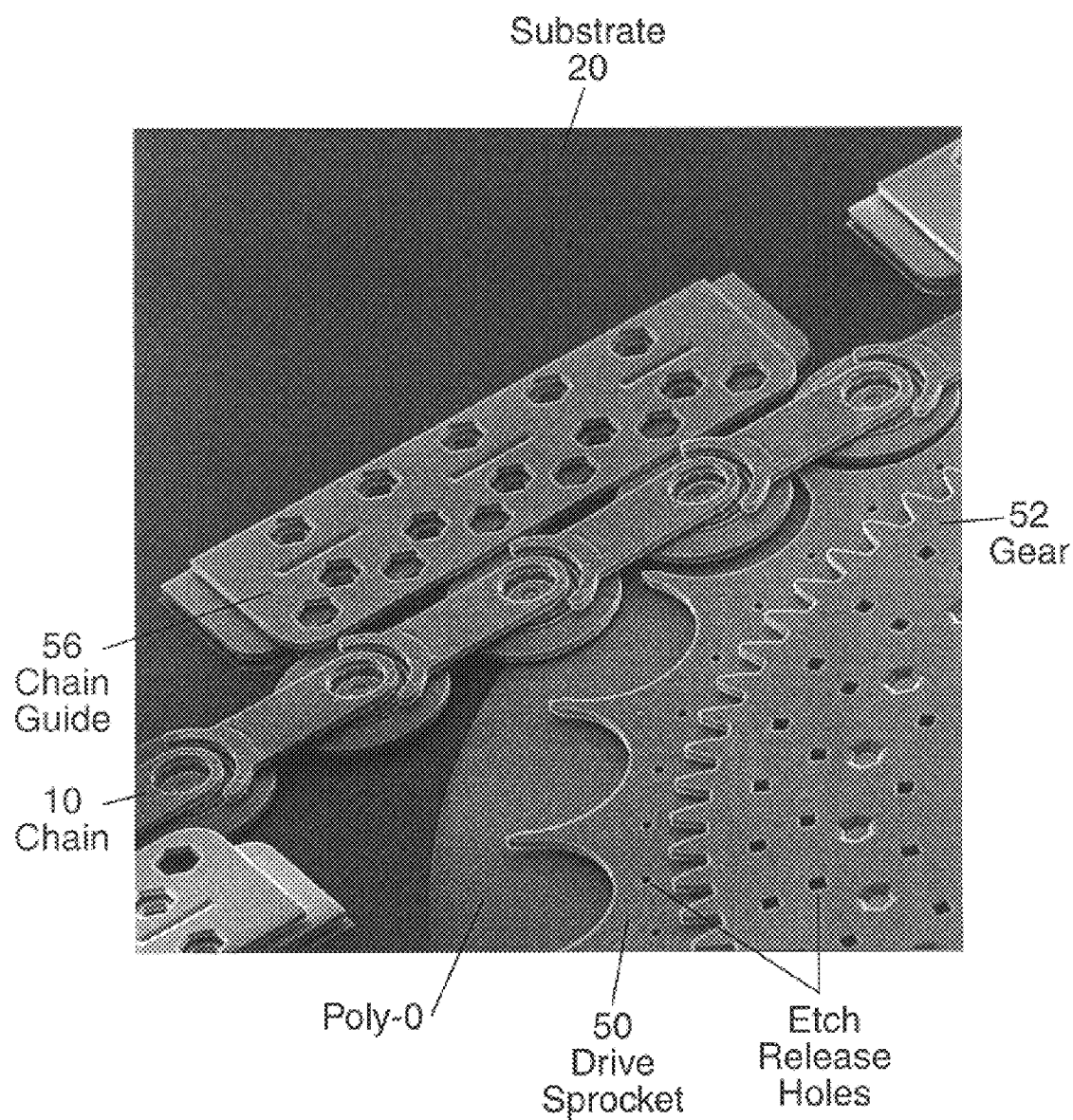
FIG. 3 shows a scanning electron microscope (SEM) image of a portion of a chain fabricated by surface micromachining according to the present invention, with the chain being engaged with a drive sprocket also fabricated by surface micromachining.
Figure 5:
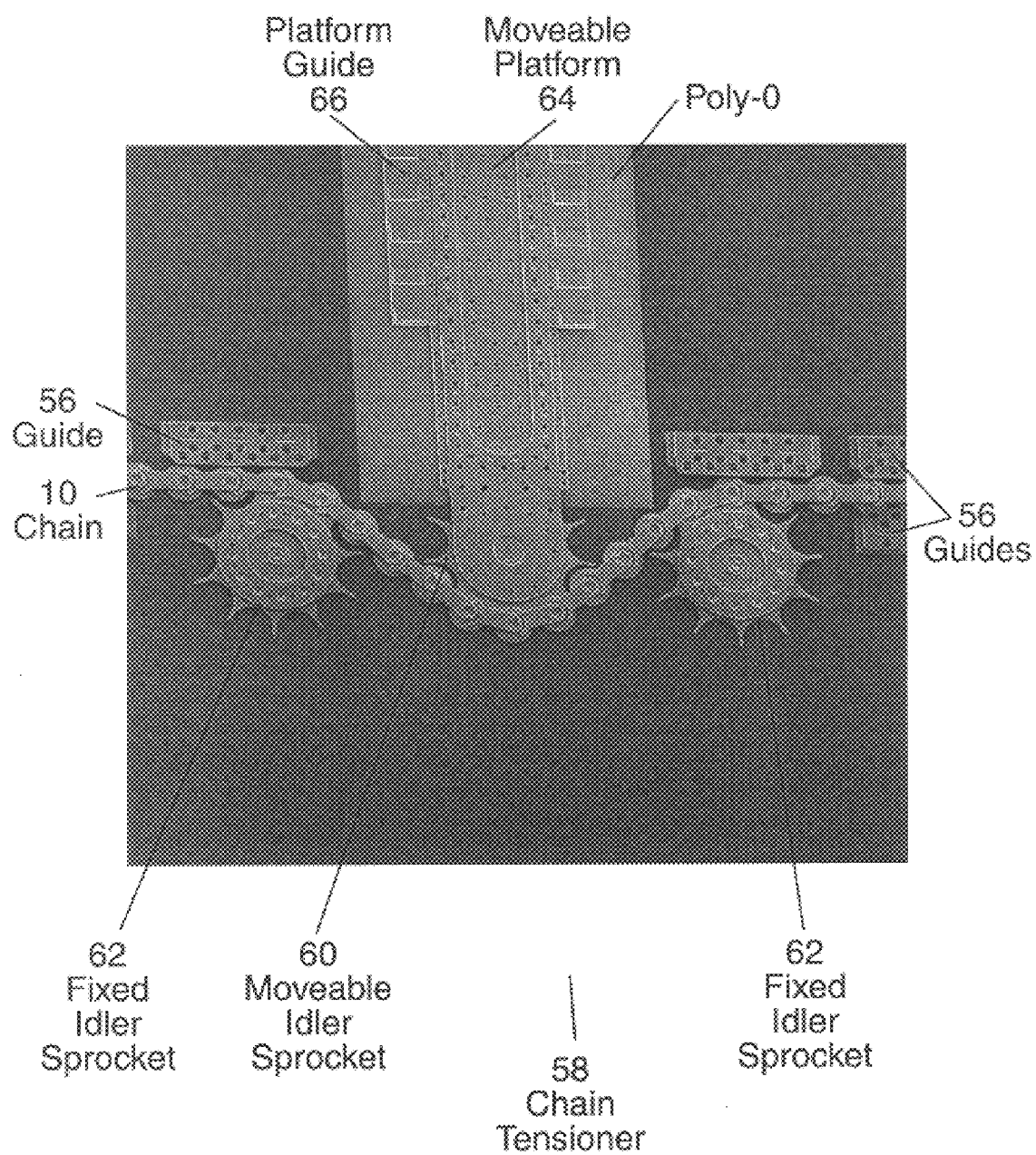
FIG. 5 shows details of a chain tensioner which can be formed on the substrate to take up slack in the surface-micromachined chain.
Figure 7:
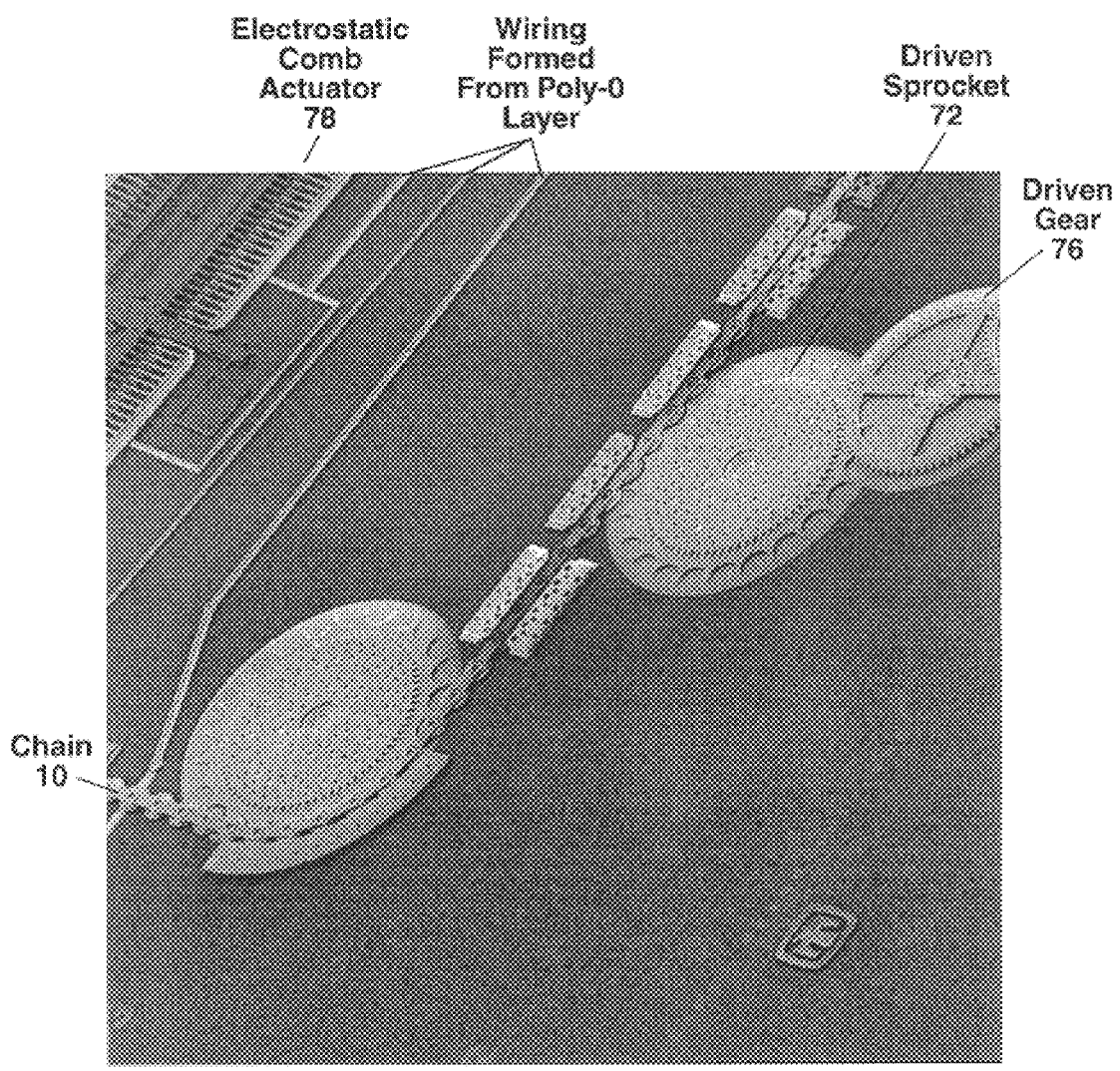
FIG. 7 shows an SEM image of a portion of a fabricated MEM device similar to that illustrated in FIG. 6.

After formation of the thermal oxide and silicon nitride layers 22 and 24, a thin layer of polysilicon (also termed herein "Poly-0") about 0.3 $\mu$m thick can be blanket deposited over the top surface of the substrate and patterned to form electrical wiring on the substrate 20 and also to form a ground plane underlying various elements of a MEM device 100 which can be formed on the substrate 20 at the same time the chain 10 is being formed (see FIGS. 3, 5 and 7). The Poly-0 layer and other polysilicon layers described hereinafter can be deposited by low-pressure chemical vapor deposition (LPCVD) at a temperature of about 580° C. Doping of the polysilicon layers for electrical conductivity can be performed as needed by thermally diffusing boron or phosphorous into the layers, or by ion implanting the polysilicon layers. Doping of the chain 10 can be beneficial to eliminate static charges thereon which can otherwise produce adhesion (i.e. stiction) of the chain 10 to the underlying substrate 20.

After deposition, the Poly-0 layer and other polysilicon layers described hereinafter can be annealed at a temperature of about 1100° C. for several hours (e.g. three hours) to relieve any stress therein. The annealing step is preferably performed after patterning of each polysilicon layer and after encapsulation of that layer by an overlying layer of a sacrificial material 26. The overlayer of the sacrificial material 26 prevents any outgassing of dopant ions (i.e. boron or phosphorous ions) which could otherwise possibly contaminate a chamber wherein the annealing is performed. The Poly-0 layer is not shown in FIGS. 2A–2P since it is generally removed underneath the chain 10.

Figure 2B:
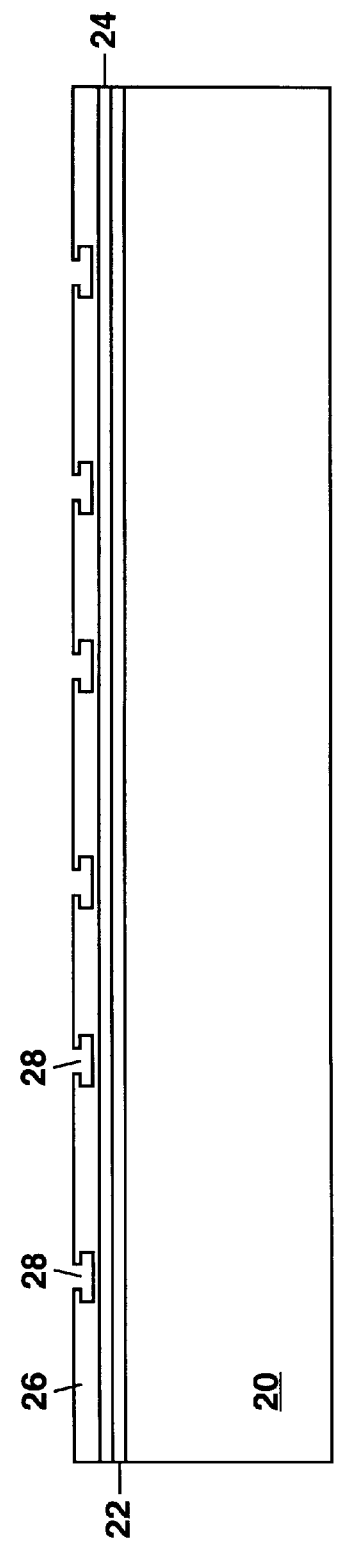

In FIG. 2B, a first layer of the sacrificial material 26 is blanket deposited over the substrate 20 to a layer thickness of about 2 $\mu$m and patterned by photolithographic masking and etching. The sacrificial material 26 can comprise a silicate glass or silicon dioxide. The silicate glass can be, for example, deposited from the decomposition of tetraethylortho silicate, also termed TEOS, by low-pressure chemical vapor deposition at about 750° C. and densified by a high temperature processing.

The term "sacrificial material" as used herein refers to a material that can be deposited and patterned as an aid in building up the structure of the chain 10 and other micromachined elements or devices to be formed on the substrate, and which can later be removed by a selective wet etching step to release the chain 10 and other micromachined elements or devices for operation. The sacrificial material 26 generally comprises a silicate glass or silicon dioxide which can be selectively etched away by an etchant comprising hydrofluoric acid (HF) which does not substantially chemically attack polysilicon or silicon nitride.

After deposition of the first layer of the sacrificial material 26, a plurality of annular undercut trenches 28 can be etched partially through the sacrificial material 26 as shown in FIG. 2B. These undercut trenches 28 will be filled with polysilicon to form an annular lip 30 around the inner circular member 16 so that the member 16 will be retained by the outer annular member 18 while permitting relative rotation of the members 16 and 18 to allow the chain 10 to bend in the plane of the substrate 20. The undercut trenches 28 can be, for example, etched to about 1.5 μm deep using an isotropic reactive ion etching process. The exact dimensions of the undercut trenches 28 and other lateral dimensions of the chain 10 will depend upon a size of the chain 10 that is being formed on the substrate 20. As an example, for a chain 10 having a pitch of 50 μm (i.e. a spacing of 50 μm between each pair of adjacent link bodies 12), the outer annular member 18 can have a diameter of 48 μm, and the link arms 14 can have a width of 20 μm. In general, the link spacing of a chain 10 formed according to the present invention can be in the range of about 5 μm to 1000 μm depending upon a particular application for the chain 10.

Figure 2C:
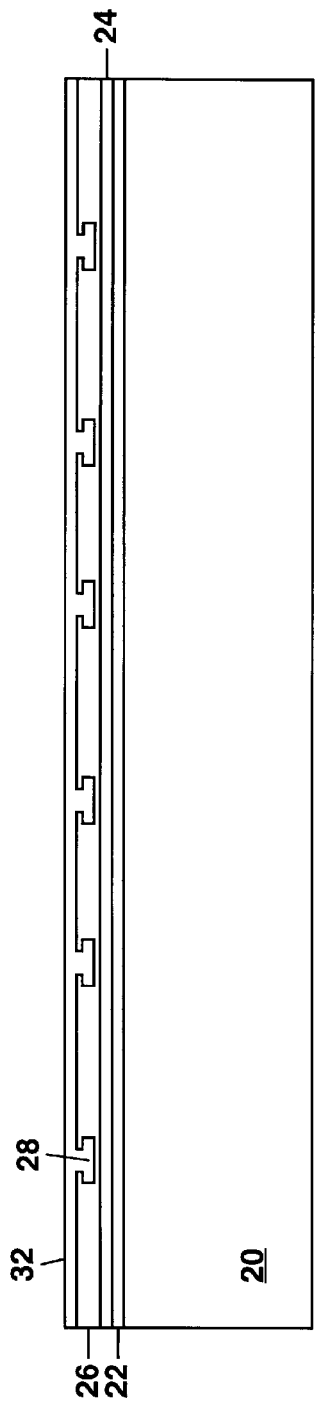
Figure 2D:
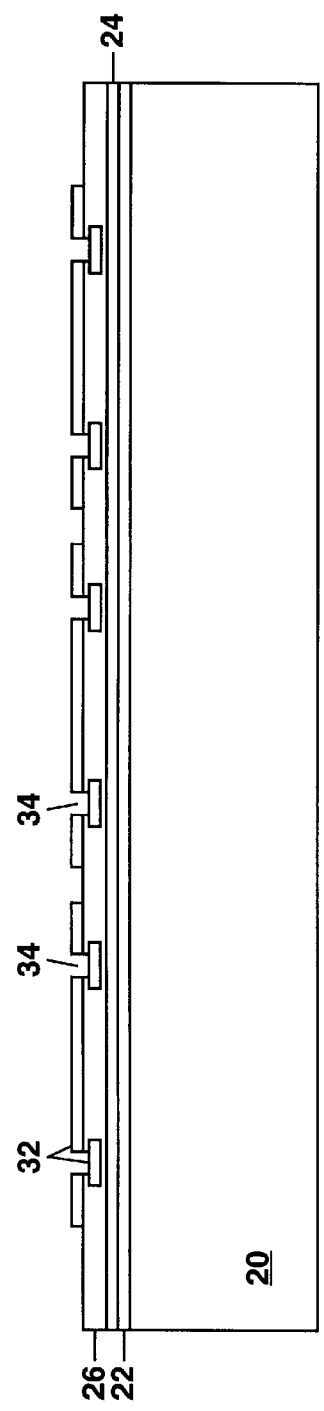

In FIG. 2C, a first structural layer 32 of polysilicon (also termed herein "Poly-1") can be deposited to blanket the substrate 20 and to fill in the undercut trenches 28 to form each annular lip 30. The Poly-1 layer 32 can be about 1 μm thick. In FIG. 2D, the Poly-1 layer 32 is patterned by photolithographic masking and anisotropic reactive ion etching to begin to define the structure of the chain 10 being built-up on the substrate 20. A plurality of annular openings 34 are formed over the annular undercut trenches 28 to separate the outer annular member 18 being formed from the inner circular member 16 to which the annular lip 30 is attached.

Figure 2E:
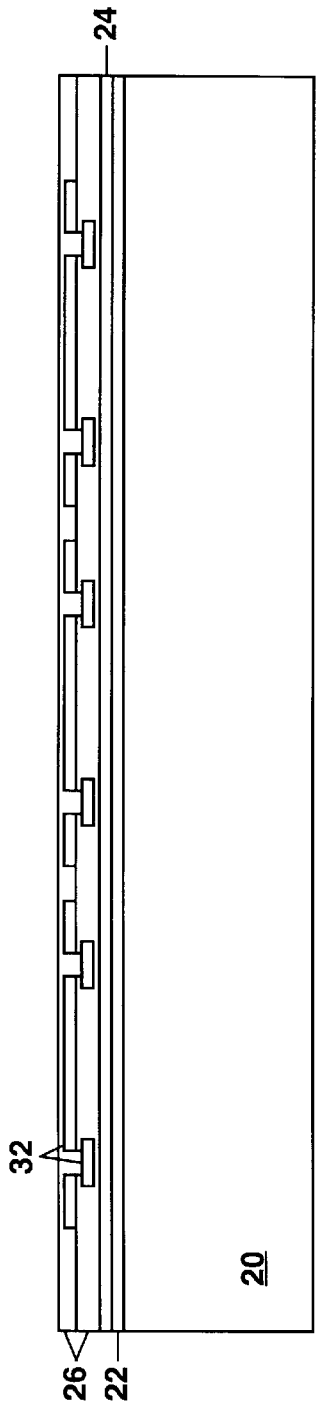

In FIG. 2E, a second layer of the sacrificial material 26 is blanket deposited over the substrate 20 filling in the annular openings 34 and spaces between various portions of the patterned Poly-1 layer 32. The second layer of the sacrificial material 26 can be deposited to a greater thickness than is needed. Then the sacrificial material 26 can be planarized using chemical-mechanical polishing (CMP) to precisely adjust the thickness of the second layer of the sacrificial material 26 to about 0.5 μm. By planarizing the sacrificial material 26, topographical variations on the substrate 20 can be reduced and potential mechanical interferences between various elements of the chain 10 can be eliminated. The use of chemical-mechanical polishing for planarizing layers in surface micromachining and ICs is well-known and is disclosed, for example, in U.S. Pat. No. 5,804,084 to Nasby which is incorporated herein by reference.

Figure 2F:
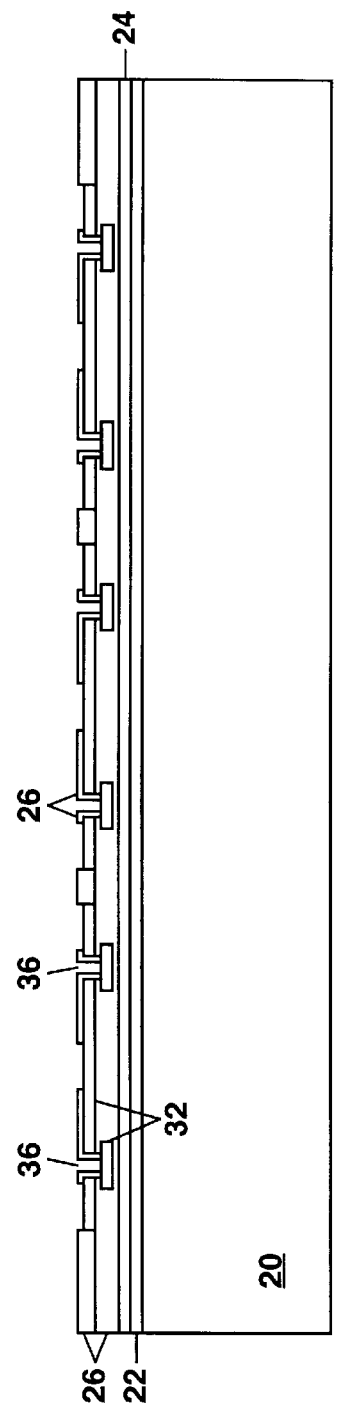

In FIG. 2F, a plurality of annular trenches 36 are etched through the second layer of the sacrificial material 26 to expose the Poly-1 layer 32 in the undercut trenches 28. Additional patterning of the second layer of the sacrificial material 26 is also done to expose other portions of the Poly-1 layer 32 for connection to a subsequently-deposited polysilicon layer to further build up the two-part link body 12. Patterning of the second layer of the sacrificial material 26 to different depths can be done using a plurality of masking and etching steps, with an etch mask being used to cover particular portions of the second layer of sacrificial material 26 during etching of the remaining exposed portions of the sacrificial material 26.

Figure 2G:
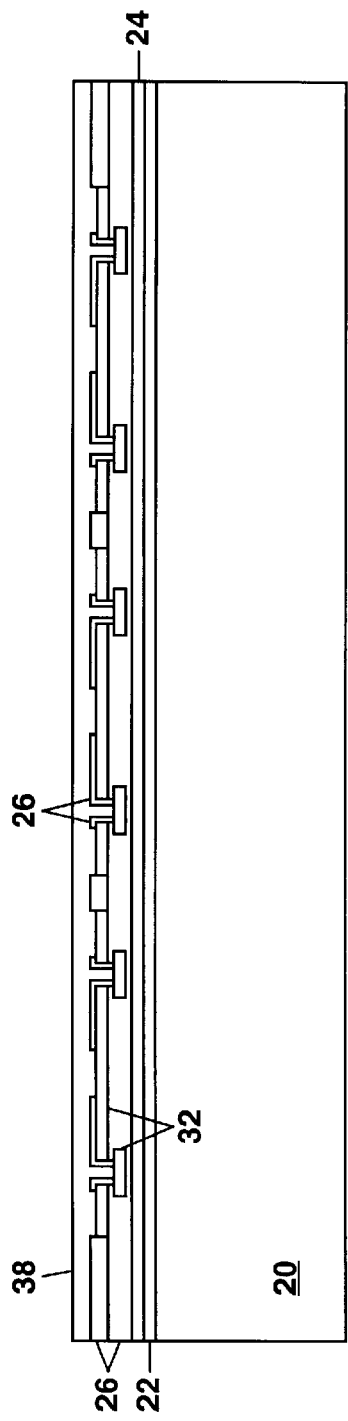
Figure 2H:
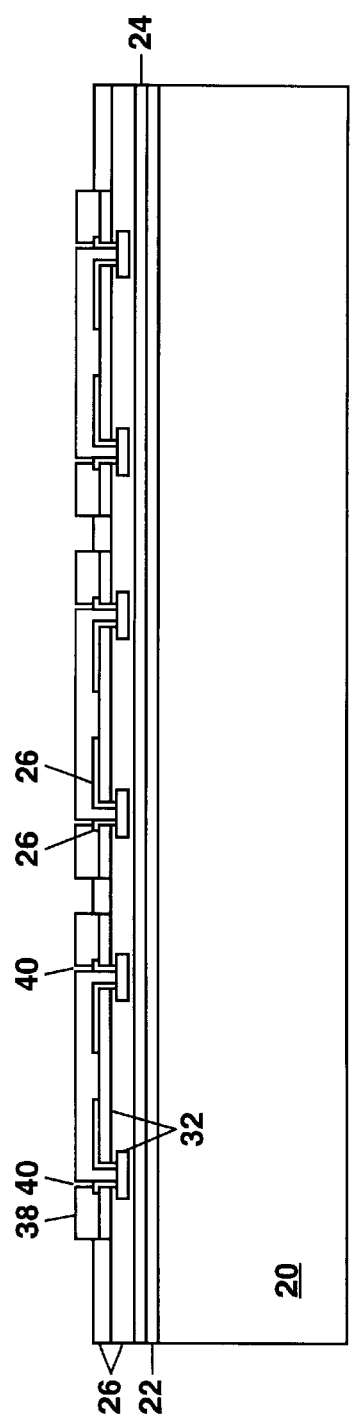

In FIG. 2G, a second layer 38 of polysilicon (also termed herein "Poly-2") is blanket deposited over the substrate 20 by LPCVD to form mechanical connections to exposed portions of the Poly-1 layer 32. The Poly-2 layer 38 can be about 1.5 μm thick. In FIG. 2H, the Poly-2 layer 38 is patterned by anisotropic reactive ion etching to further build-up the two-part link body 12, with generally circular trenches 40 being etched down through the Poly-2 layer 38 to the underlying sacrificial material 26 to separate each inner circular member 16 from each outer annular member 18 (see also FIG. 1B).

In FIG. 2I, a third layer of the sacrificial material 26 is blanket deposited over the substrate 20 and planarized by CMP. The third layer of the sacrificial material 26 fills in the circular trenches 40 to separate the inner circular members 16 from the outer annular members 18. In FIG. 2J, the third layer of the sacrificial material 26 is patterned by anisotropic reactive ion etching to provide a plurality of shaped openings 42 down to the underlying Poly-2 layer 38. The shaped openings 42 can be, for example, in the form of circular trenches.

In FIG. 2K, a third layer 44 of polysilicon (also termed herein "Poly-3") can be blanket deposited over the substrate using LPCVD to fill in the shaped openings 42 and form mechanical connections to the underlying patterned Poly-2 layer 38. The Poly-3 layer 44, which can be about 2 μm thick, is then patterned as shown in FIG. 2L to complete the structure of the two-part link body 12 (see also FIGS. 1B and 4).

Figure 2M:
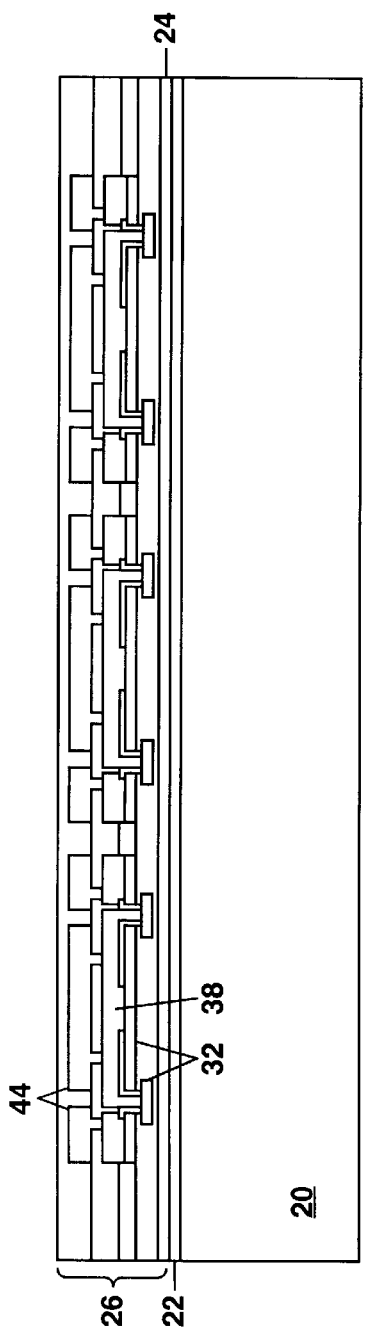
Figure 2N:
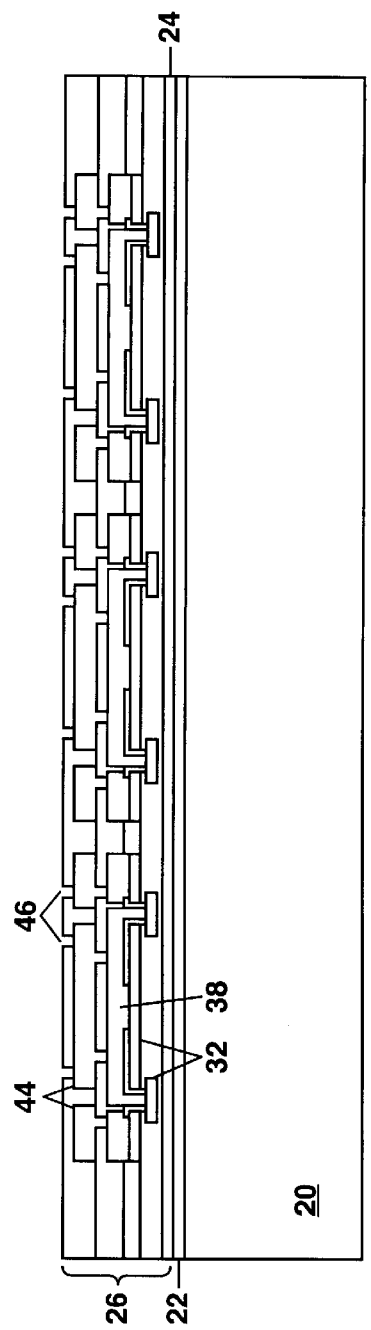

In FIG. 2M, a fourth layer of the sacrificial material 26 is blanket deposited over the substrate 20 and is planarized by CMP. In FIG. 2N, the fourth layer of the sacrificial material 26, which can be about 2 μm thick at its greatest extent, is patterned to form a plurality of vias 46 down to the underlying Poly-3 layer 44. The vias 46 can be, for example, in the form of circular wells and/or curved trenches (see FIG. 4).

In FIG. 2O, a fourth layer 48 of polysilicon (also termed herein "Poly-4") is blanket deposited over the substrate 20 to a layer thickness of about 2 μm. The Poly-4 layer 48 is patterned in FIG. 2P and is used to form the link arms 14 of the chain 10 and to permanently attach the link arms 14 to the members 16 and 18 of the two-part link body 12 (see also FIGS. 1A, 1B and 4). Adjacent link arms 14 are coplanar since they are all formed from the same deposited and patterned Poly-4 layer 48. At this point, the structure of the surface-micromachined chain 10 is complete although it is still embedded in the various layers of the sacrificial material 26.

A final layer (not shown) of about 0.5–1 μm of the sacrificial material 26 can be deposited over the substrate 20 to encapsulate the structure of the chain 10 in preparation for a final annealing step used to relieve any stress in the patterned Poly-4 layer 48. An etch release step can then be used to remove the various layers of the sacrificial material 26, thereby freeing the chain 10 and other elements of a MEM device 100 formed on the substrate 20 for operation. Once freed, the individual links in the chain 10 will be able to flex or bend in a plane parallel to the substrate 20 while being substantially inflexible in a direction perpendicular to the substrate 20.

The etch release step is based on the use of a selective wet etchant that etches away exposed portions of the sacrificial material 26 over time, while leaving the polysilicon structure of the chain 10 intact. The selective wet etchant can comprise HF or an HF solution when the sacrificial material 26 is a silicate glass (e.g. TEOS) or silicon dioxide. The etch release step can be performed over a period of several hours. Additionally, a plurality of generally micron-sized etch release holes can be formed, as needed, through the various polysilicon layers during patterning thereof so that the selective wet etchant can reach the various portions of the sacrificial material 26 (see FIG. 3). Some portions of the sacrificial material (e.g. within the center of the inner circular member 16 between the Poly-2 and Poly-3 layers as shown in FIG. 1B) can be left in place (e.g. by not providing any etch release holes) to form a part of the structure of the chain 10.

Figure 4:
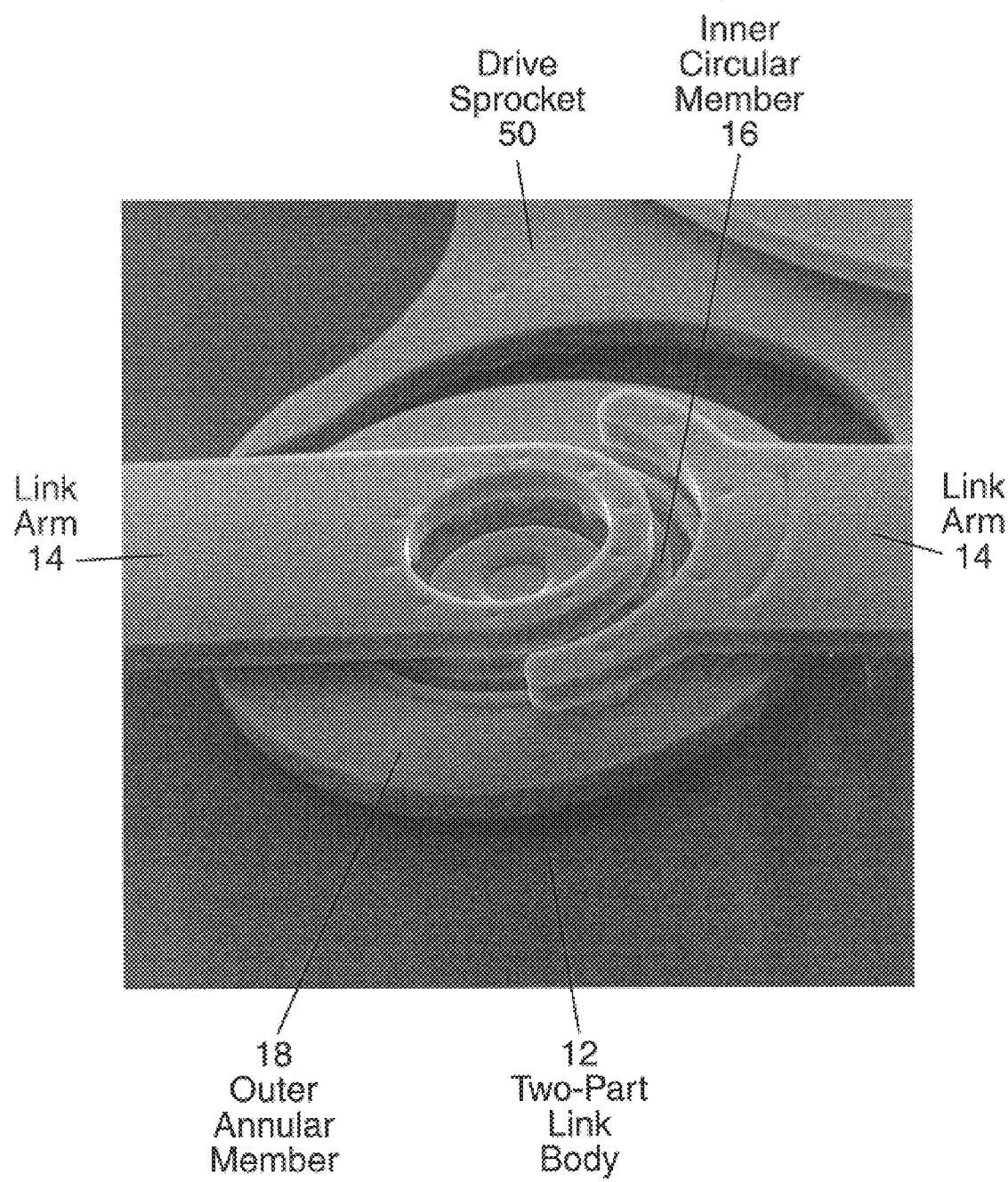
FIG. 4 shows details of a single link of the surface-micromachined chain in FIG. 3.
Figure 6:
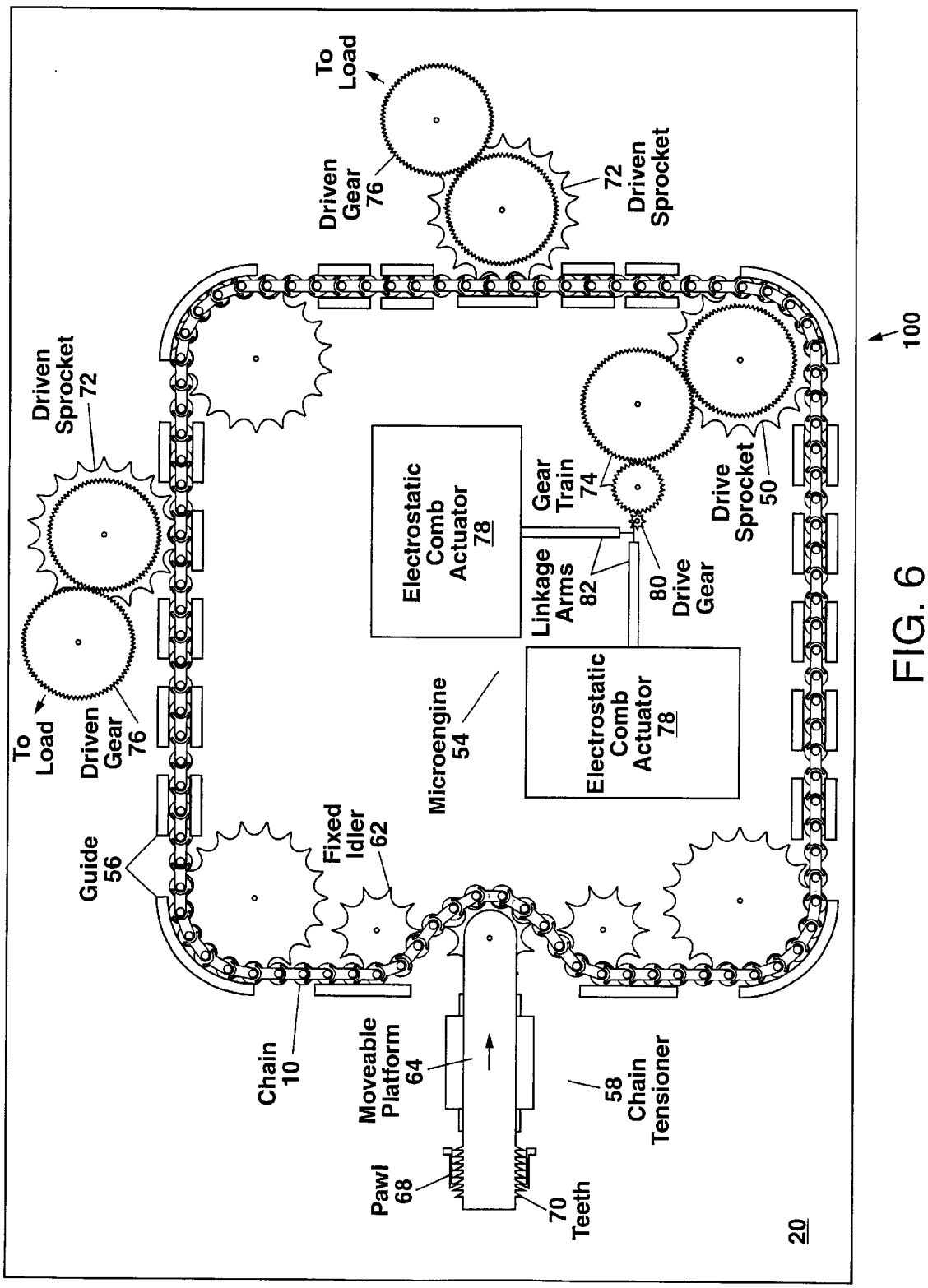
FIG. 6 shows a schematic plan view of a MEM device fabricated on a substrate and utilizing the surface-micromachined chain of the present invention to couple mechanical power from a microengine through a drive sprocket to a plurality of driven sprockets.

The completed chain 10 after the etch release step is shown in FIGS. 3–5. In FIG. 3, a portion of the surface-micromachined chain 10 is shown enmeshed with a drive sprocket 50 which can be formed from the same polysilicon layers (i.e. Poly-1 through Poly-4) that are used to form the chain using the process described with reference to FIGS. 2A–2P. The drive sprocket 50 further includes an integral gear 52 formed in the Poly-4 layer 48, and an underlying ground plane formed from the Poly-0 layer. The gear 52 can have, for example, seventy-five teeth; and the drive sprocket 50 can have twenty-four teeth with an overall diameter of about 380 $\mu$m. The gear 52 can form part of a gear train that is connected to a microengine 54 for driving the chain 10 as part of a MEM device 100 as shown in FIGS. 6 and 7. No piece-part assembly of the chain 10 or other elements of the MEM device 100 is required since all elements are fabricated in place by the surface micromachining process described previously with reference to FIGS. 2A–2P. This allows the chain 10 and the MEM device 100 to be fabricated on a microscopic scale which would be impossible using conventional machining methods based on stamping, casting, milling and drilling operations. The chain 10 in FIG. 3 with a width of about 50 $\mu$m is smaller than the width of a human hair.

To restrict vertical motion of the chain 10, a plurality of chain guides 56 can be also be formed on the substrate 20 alongside the path of the chain 10 as shown in FIG. 3. These chain guides 56 are formed of the Poly-0 through Poly-4 layers using the process described with reference to FIGS. 2A–2P The Poly-0 through Poly-3 layers are used to form a support for a tab which is fabricated in the Poly-4 layer 48 to extend outward slightly into the path of the chain 10 overlying part of one or more of the two-part link bodies 12 as shown in FIG. 3. In this way, the chain 10 can move along its path while being vertically restrained by the chain guides 56 so that the chain 10 does not disengage from various sprockets in a MEM device 100 wherein the chain 10 is used.

FIG. 4 shows a single two-part link body 12 with one link arm 14 connected to the inner circular member 16 of the link body 12, and with another link arm 14 connected to the outer annular member 18. Various dimples and troughs shown on the top surfaces of the link arms 14 and the members 16 and 18 are due to the deposition of the Poly-3 and Poly-4 layers into the shaped openings 42 and vias 46 formed in the third and fourth layers of the sacrificial material 26.

When forming the chain 10 in place adjacent to a plurality of sprockets, it is necessary to leave a gap filled with the sacrificial material 26 between the chain 10 and each sprocket which is enmeshed with the chain 10 in order to later separate the chain 10 from the sprockets during the etch release step. This gap is determined by a minimum feature size (generally 1 $\mu$m) which can be produced using surface micromachining. As a result, there is some slack in the chain 10 which generally must be taken up for proper operation of the chain 10. This can be done by providing a chain tensioner 58 on the substrate 20 as shown in FIG. 5. The chain tensioner 58 can comprise an idler sprocket 60 which can be moved laterally in a direction substantially normal to a path of the chain 10 so that the moveable idler sprocket 60 deflects the chain 10 and thereby reduces the slack therein. A pair of fixed idler sprockets 62 can also be provided as shown in FIG. 5 to keep the chain 10 on its intended path for the remainder of its course. In FIG. 5, each idler sprocket 60 and 62 has eleven teeth and an overall diameter of about 180 $\mu$m.

The chain tensioner 58 can further comprise a moveable platform 64 on which the moveable idler sprocket 60 is mounted. The moveable platform 64 is slideable within a pair of platform guides 66 so that the idler sprocket 60 can be moved in a direction normal to the path of the chain 10. Pawls 68 on one or both sides of the platform 64 engage teeth 70 formed in the sides of the platform 64 as shown in FIG. 6 so that once the platform 64 and idler sprocket 60 have been manually moved into place to tension the chain 10 (e.g. under a microscope using a probe tip), the chain 10 will remain permanently tensioned without the need for any further adjustment. The chain tensioner 58 can be formed from the Poly-1 through Poly-4 layers using the same process steps described previously with reference to FIGS. 2A–2P Additionally, the Poly-0 layer can be left in place underneath the chain tensioner 58 as shown in FIG. 5 to serve as a ground plane.

To reduce the amount of tensioning required to take up the slack in the chain 10, each link in the chain 10 which is not fabricated enmeshed with a sprocket can be sized slightly larger (e.g with a diameter that is about 2 $\mu$m larger) than the other links which are fabricated enmeshed with the sprocket so that no gap exists when these larger-size links later mesh with the sprockets during movement of the chain 10. This helps to minimize the slack in the chain 10 to an amount which depends upon the number of chain links which are enmeshed with the sprockets in an as-fabricated position.

The present invention can be used to fabricate various types of surface-micromachined structures (i.e. MEM devices) 100 that use a drive sprocket 50 to couple motive power through a surface-micromachined chain 10 to one or more driven sprockets 72. Such MEM devices 100 can be useful, for example, to form microminiature coded locks, pop-up mirrors, optical shutters, self-assembled structures etc. Additionally, such MEM devices 100 utilizing a chain drive mechanism are useful whenever it is necessary to synchronize a plurality of rotating sprockets, whenever multiple rotating members (e.g. multiple driven sprockets) must be driven with a single microengine, or whenever multiple microengines must be ganged together to provide mechanical force in excess of that available from a single microengine. The ability to drive multiple rotating members with a single microengine can also result in considerable space savings on the substrate 20 due to the relatively large size of conventional microengines. This can be seen from FIG. 6 which shows an example of a MEM device 100 utilizing the chain 10 of the present invention to drive multiple rotating members (i.e. multiple driven sprockets 72) using a single microengine 54.

In FIG. 6, mechanical power is provided by a microengine 54 which drives a gear train 74 to couple the mechanical power to the drive sprocket 50. The drive sprocket 50 then urges the chain 10 to move along a predetermined path in sliding contact with the substrate 20 to rotate one or more driven sprockets 72. The driven sprockets 72 can each be operatively connected to a driven gear 76 which can then couple the mechanical power to other elements of the MEM device 100 as needed for rotating or translating members to perform particular tasks which, in general, will depend upon a particular type of MEM device 100 being formed. The chain 10 provides a constant drive ratio without slippage or creep.

The MEM device 100 illustrated in FIG. 6 can be formed from the Poly-0 through Poly-4 layers as described previously with reference to FIGS. 2A–2P. The microengine 54 can comprise a pair of electrostatic comb actuators 78 which are electrically activated 90° out-of-phase with respect to each other to rotate a drive gear 80 through a pair of coupled linkage arms 82. Further details of this type of microengine 54 can be found in U.S. Pat. No. 5,631,514 to Garcia et al, which is incorporated herein by reference. Those skilled in the art will understand that other types of microengines 54 can be formed from one or more electrostatic or thermal actuators. Such microengines can include ratchet mechanisms wherein one or more pawls are moved by an actuator to repeatedly engage ratchet teeth on a gear or sprocket and rotate the gear or sprocket over an angle.

FIG. 7 shows a scanning electron microscope (SEM) image of a portion of a MEM device 100 similar to that of FIG. 6. In FIG. 7, one of the electrostatic comb actuators 78 of the microengine 54 is visible. Additionally, FIG. 7 shows electrical wiring formed from the Poly-0 layer for electrically activating the microengine 54 (e.g. by connecting the microengine 54 to a plurality of bond pads on the substrate 20 and therefrom to an electrical power source). Further details of the driven sprocket 72 and driven gear 76 can also be seen in FIG. 7. The chain 10 in FIG. 7 has a pitch (i.e. a separation of adjacent chain links) of 50 $\mu$m, with the driven sprocket 72 having twenty-four teeth and an overall diameter of about 380 $\mu$m.

In other embodiments of the present invention, silicon nitride layers can be substituted for one or more of the polysilicon layers in forming the surface-micromachined chain 10. The silicon nitride can be, for example, a low-stress silicon nitride deposited by plasma-enhanced chemical vapor deposition (PECVD) at about 600° C. or less.

The matter set forth in the foregoing description and accompanying drawings is offered by way of illustration only and not as a limitation. Other applications and variations of the apparatus and method of the present invention will become evident to those skilled in the art. Although the chain 10 has been described herein with a link arm 14 formed above the two-part link body 12, those skilled in the art will understand that the link arm 14 can also be formed below the link body 12 by reversing the order of fabricating the chain 10 (e.g. by forming the link arm 14 in the Poly-1 layer and fabricating the link body 12 in the Poly 2 through Poly 4 layers). Other embodiments of the present invention can be fabricated with a first link arm below the link body 12 and with a second link arm above the link body 12. This can be done, for example, by either reducing the number of polysilicon layers used to form the link body 12, or by providing one or more additional polysilicon layers (e.g. a Poly-5 layer). Those skilled in the art will understand that other shapes can be used for the link body 12 and/or the link arm 14 depending upon particular applications of the surface-micromachined chain. The actual scope of the invention is intended to be defined in the following claims when viewed in their proper perspective based on the prior art.

What is claimed is:

1. A surface-micromachined chain, comprising a plurality of interconnected chain links, with each chain link further comprising a plurality of deposited and patterned material layers.

2. The chain of claim 1 wherein each chain link comprises a two-part link body having an inner circular member surrounded by an outer annular member, and at least one link arm extending outward from the outer annular member to connect to the inner circular member of an adjacent two-part link body.

3. The chain of claim 2 wherein each chain link comprises polycrystalline silicon.

4. The chain of claim 2 wherein each link arm is permanently attached to the outer annular member of one two-part link body and to the inner circular member of an adjacent two-part link body.

5. The chain of claim 2 wherein a first link arm on one of the chain links is coplanar with a second link arm on an adjacent chain link.

6. The chain of claim 1 wherein the interconnected chain links are formed on a substrate.

7. The chain of claim 6 wherein the chain links are formed integrally on the substrate without any piece-part assembly.

8. The chain of claim 6 wherein substrate comprises silicon.

9. The chain of claim 6 wherein each chain link is moveable over a surface of the substrate in sliding contact with the surface of the substrate.

10. The chain of claim 6 wherein each chain link is flexible in a plane parallel to the substrate and substantially inflexible in a direction perpendicular to the substrate.

11. The chain of claim 1 wherein each chain link has a length in the range of 5–1000 microns.

12. The chain of claim 1 wherein each chain link has a thickness in the range of 2–20 microns.

13. The chain of claim 1 wherein each chain link is substantially identical in size and shape.

14. A surface-micromachined chain formed integrally on a substrate for coupling mechanical power from a motive source to a load on the substrate, with the chain comprising a plurality of link arms connected at each end thereof to flexible joints, and with the link arms and flexible joints being formed, at least in part, from polycrystalline silicon.

15. The chain of claim 14 wherein each flexible joint comprises an inner circular member surrounded by an outer annular member, with the inner circular member being permanently attached to one end of one of the link arms and with the outer annular member being permanently attached to an opposite end of an adjacent link arm.

16. The chain of claim 15 wherein each outer annular member is substantially circular in shape.

17. The chain of claim 14 wherein the substrate comprises silicon.

18. The chain of claim 14 wherein the link arms and the flexible joints are formed from a plurality of deposited and patterned layers of polycrystalline silicon.

19. The chain of claim 14 wherein each flexible joint is adapted to drive or to be driven by a sprocket formed on the substrate.

20. The chain of claim 14 wherein a pair of adjacent flexible joints are spaced by a distance in the range of 5–1000 microns.

21. A surface-micromachined structure formed on a substrate and comprising:
   (a) a drive sprocket formed on the substrate for providing motive power;

(b) a driven sprocket formed on the substrate at a distance from the drive sprocket; and (c) a chain formed on the substrate, at least in part, from polycrystalline silicon and connected between the drive sprocket and the driven sprocket to couple the motive power from the drive sprocket to the driven sprocket thereby imparting motion to the driven sprocket.

22. The structure of claim 21 further comprising at least one electrostatic actuator formed on the substrate and operatively connected to the drive sprocket to rotate the drive sprocket.

23. The structure of claim 22 further comprising a chain tensioner for reducing any slack in the chain.

24. The structure of claim 23 wherein the chain tensioner comprises a laterally-moveable idler sprocket formed on the substrate, with the idler sprocket being mounted on a platform and moveable into a path of the chain to deflect the chain and thereby reduce the slack therein.

25. The structure of claim 21 wherein the substrate comprises silicon.

26. The structure of claim 21 wherein the chain comprises a plurality of interconnected chain links, with each chain link further comprising a two-part link body having an outer annular member surrounding an inner circular member, and at least one link arm extending outward from the outer annular member to connect to the inner circular member of an adjacent two-part link body.

27. The structure of claim 26 wherein each chain link has a length in the range of 5–1000 microns.

28. The structure of claim 27 wherein each chain link has a thickness in the range of 2–20 microns.

29. A surface-micromachined structure formed on a substrate and comprising:

(a) an microengine formed on the substrate;

(b) a drive sprocket formed on the substrate proximate to the microengine and operatively connected to the microengine, with the drive sprocket being rotatable upon electrical actuation of the microengine;

(c) at least one driven sprocket formed on the substrate distal to the drive sprocket; and (d) a chain formed on the substrate from a plurality of deposited and patterned material layers, with the chain connecting the drive sprocket to the driven sprocket, thereby imparting motion to the driven sprocket upon rotation of the drive sprocket.

30. The structure of claim 29 further comprising a chain tensioner for reducing any slack in the chain.

31. The structure of claim 30 wherein the chain tensioner comprises a laterally-moveable idler sprocket that is mounted on a platform and moveable into a path of the chain to deflect the chain and thereby reduce the slack therein.

32. The structure of claim 29 wherein the plurality of deposited and patterned material layers forming the chain includes at least one layer of polycrystalline silicon.

33. The structure of claim 29 wherein the chain comprises a plurality of interconnected chain links, with each chain link further comprising a two-part link body having an outer annular member surrounding an inner circular member, and at least one link arm extending outward from the outer annular member to connect to the inner circular member of an adjacent two-part link body.

34. The structure of claim 33 wherein each link arm is permanently attached to the outer annular member of one two-part link body and to the inner circular member of an adjacent two-part link body.

35. The structure of claim 33 wherein a first link arm on one of the chain links is coplanar with a second link arm on an adjacent chain link.

36. The structure of claim 33 wherein each chain link has a length in the range of 5–1000 microns.

37. A method for forming a surface-micromachined chain on a substrate for coupling mechanical power from a motive source on the substrate to a load on the substrate, comprising steps for:

(a) depositing and patterning a plurality of alternating layers of a chain-forming material and a sacrificial material on the substrate, thereby forming a plurality of interconnected chain links embedded in the layers of the sacrificial material; and (b) removing the sacrificial material by etching and thereby releasing the chain for operation.

38. The method of claim 37 wherein each layer of the chain-forming material comprises polycrystalline silicon.

39. The method of claim 38 further including a step for annealing each layer of the polycrystalline silicon chain-forming material after deposition and patterning thereof.

40. The method of claim 37 wherein the sacrificial material comprises silicon dioxide or a silicate glass.

41. The method of claim 40 wherein the step for removing the sacrificial material by etching comprises exposing the sacrificial material to a selective wet etchant comprising hydrofluoric acid.

* * * * *